(12) United States Patent
Liu (10) Patent No.: US 11,698,409 B2
(45) Date of Patent: Jul. 11, 2023

(54) TEST METHOD AND SYSTEM FOR TESTING CONNECTIVITY OF SEMICONDUCTOR STRUCTURE

(71) Applicant: CHANGXIN MEMORY TECHNOLOGIES, INC., Hefei (CN)

(72) Inventor: Geyan Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 16 days.

(21) Appl. No.: 17/650,849

(22) Filed: Feb. 12, 2022

(65) Prior Publication Data

US 2023/0029337 A1 Jan. 26, 2023

Related U.S. Application Data

(63) Continuation of application No. PCT/CN2021/121298, filed on Sep. 28, 2021.

(30) Foreign Application Priority Data

Jul. 22, 2021 (CN) .......................... 202110831423.8

(51) Int. Cl.
*G01R 31/28* (2006.01)
*G01R 31/26* (2020.01)
(52) U.S. Cl.
CPC ..... *G01R 31/2853* (2013.01); *G01R 31/2623* (2013.01)
(58) Field of Classification Search
CPC ............ G01R 31/2853; G01R 31/2623; G01R 31/2884; G01R 31/2856

USPC ..................... 324/762.01, 537, 500
See application file for complete search history.

(56) References Cited

U.S. PATENT DOCUMENTS

2021/0181251 A1* 6/2021 Hsieh ................. G01R 31/2884
2022/0244307 A1* 8/2022 Xu ...................... G01R 31/2884
2022/0413038 A1* 12/2022 Kim ................... G01R 31/2884

FOREIGN PATENT DOCUMENTS

CN 102053207 A 5/2011

* cited by examiner

*Primary Examiner* — Giovanni Astacio-Oquendo
(74) *Attorney, Agent, or Firm* — Syncoda LLC; Feng Ma (57) ABSTRACT

A test method for testing connectivity of a semiconductor structure includes operations as follows. A semiconductor structure and a detection transistor are provided. The semiconductor structure includes a through silicon via structure having a first terminal and a second terminal arranged to be opposite. An intrinsic conductivity factor of the detection transistor is obtained. The detection transistor is turned on upon receiving a test signal, and a test voltage is provided to the second terminal, to enable the detection transistor to operate in a deep triode region, and a current flowing through the second terminal is obtained during operation of the detection transistor in the deep triode region. A resistance of the through silicon via structure is obtained based on the intrinsic conductivity factor, an operating voltage, the test voltage, and the current flowing through the second terminal.

15 Claims, 3 Drawing Sheets

TEST METHOD AND SYSTEM FOR TESTING CONNECTIVITY OF SEMICONDUCTOR STRUCTURE

CROSS-REFERENCE TO RELATED APPLICATIONS

This is a continuation of International Patent Application No. PCT/CN2021/121298 field on Sep. 28, 2021, which claims priority to Chinese Patent Application No. 202110831423.8 filed on Jul. 22, 2021. The disclosures of these applications are hereby incorporated by reference in their entirety.

BACKGROUND

With the improvement of a semiconductor structure integration, a Through Silicon Via (TSV) structure is generally utilized to penetrate a plurality of stacked chips, so that the plurality of chips are electrically connected to each other to form a three-dimensional semiconductor structure including the plurality of stacked chips. Since the semiconductor structure includes a plurality of TSVs, the chip may receive various signals by means of TSVs.

SUMMARY

Embodiments of the disclosure relate to, but are not limited to, a test method and system for testing connectivity of a semiconductor structure.

A first aspect of the embodiments of the disclosure provides a test method for testing connectivity of a semiconductor structure. The test method includes operations as follows. The semiconductor structure and a detection transistor are provided. The semiconductor structure includes a through silicon via structure having a first terminal and a second terminal which are arranged to be opposite, the detection transistor includes a detection gate, a first port and a second port, the detection gate is configured to receive a test signal, the first port is configured to receive an operating voltage, and the second port is electrically connected to the first terminal. An intrinsic conductivity factor of the detection transistor is obtained. The intrinsic conductivity factor is a product of a carrier mobility and a capacitance of a gate oxide layer per unit area under a condition that the detection transistor operates in a saturation region and a current in the detection transistor is in a first current direction. The detection transistor is turned on upon receiving the test signal, and a test voltage is provided to the second terminal, to enable the current in the detection transistor to be in a second current direction which is opposite to the first current direction, and enable the detection transistor to operate in a deep triode region, and a current flowing through the second terminal is obtained during operation of the detection transistor in the deep triode region. A resistance of the through silicon via structure is obtained based on the intrinsic conductivity factor, the operating voltage, the test voltage, and the current flowing through the second terminal.

A second aspect of the embodiments of the disclosure provides a test system for testing connectivity of a semiconductor structure. The test system includes a semiconductor structure, a detection transistor, a test voltage applying module, a current obtaining module and a resistance obtaining module. The semiconductor structure includes a through silicon via structure having a first terminal and a second terminal which are arranged to be opposite. The first terminal is electrically connected to a first chip, and the second terminal is electrically connected to a second chip. The detection transistor is arranged in the first chip. The detection transistor includes a detection gate, a first port and a second port, the detection gate is configured to receive a test signal, the first port is configured to receive an operating voltage, and the second port is electrically connected to the first terminal. The test voltage applying module is configured to provide a test voltage to the second terminal when the detection transistor is turned on upon receiving the test signal, to enable the detection transistor to operate in a deep triode region. The current obtaining module is configured to obtain a current flowing through the second terminal during operation of the detection transistor in the deep triode region. The resistance obtaining module is configured to obtain a resistance of the through silicon via structure based on an intrinsic conductivity factor, the operating voltage, the test voltage and the current flowing through the second terminal.

BRIEF DESCRIPTION OF THE DRAWINGS

One or more embodiments are illustrated by the pictures in the corresponding drawings. These exemplified descriptions do not constitute a limitation on the embodiments. Unless otherwise stated, the figures in the drawings do not constitute a proportion limit.

DETAILED DESCRIPTION

In one aspect, various defects may occur in the TSV itself, resulting in a decrease in the conductivity of the TSV itself, thereby reducing the connectivity between the chips that are electrically connected by the TSV. In another aspect, the TSV is not properly connected. For example, the chip that is actually electrically connected to the TSV is different from the chip that requires the TSV to be electrically connected during the design, which will also reduce the yield of the semiconductor structure. The above two aspects will affect an operating rate of the semiconductor structure.

Therefore, a test method is needed to determine whether the quality of the semiconductor structure is qualified by testing the connectivity between the chips in the semiconductor structure.

It can be known that there is a need for a test method for testing connectivity of a semiconductor structure at present.

Through analysis, it is found that when a through silicon via structure is utilized to connect chips in a semiconductor structure, the defects of the through silicon via structure and the incorrect connection between the through silicon via structure and the chip will adversely affect the operating rate of the semiconductor structure. The defects of the through silicon via structure include voids caused by the incomplete filling of a conductive material in the through silicon via structure, the rupture of the through silicon via structure itself, and the contact failure between the through silicon via structure and the chip due to the warpage of the chip or the migration of the bump material. The incorrect connection between the through silicon via structure and the chip may lead to a short circuit in the through silicon via structure.

Therefore, a test method for testing the connectivity of the semiconductor structure is needed to determine whether the connectivity of the semiconductor structure is good by measuring the resistance of the through silicon via structure.

The embodiments of the disclosure will be described in detail below in combination with the drawings. However, it can be understood by those skilled in the art that in various embodiments of the disclosure, many technical details have been proposed in order to give the reader a better understanding of the disclosure. However, the technical solutions claimed in the disclosure may be implemented even without these technical details and various changes and modifications based on the following various embodiments.

Figure 1:
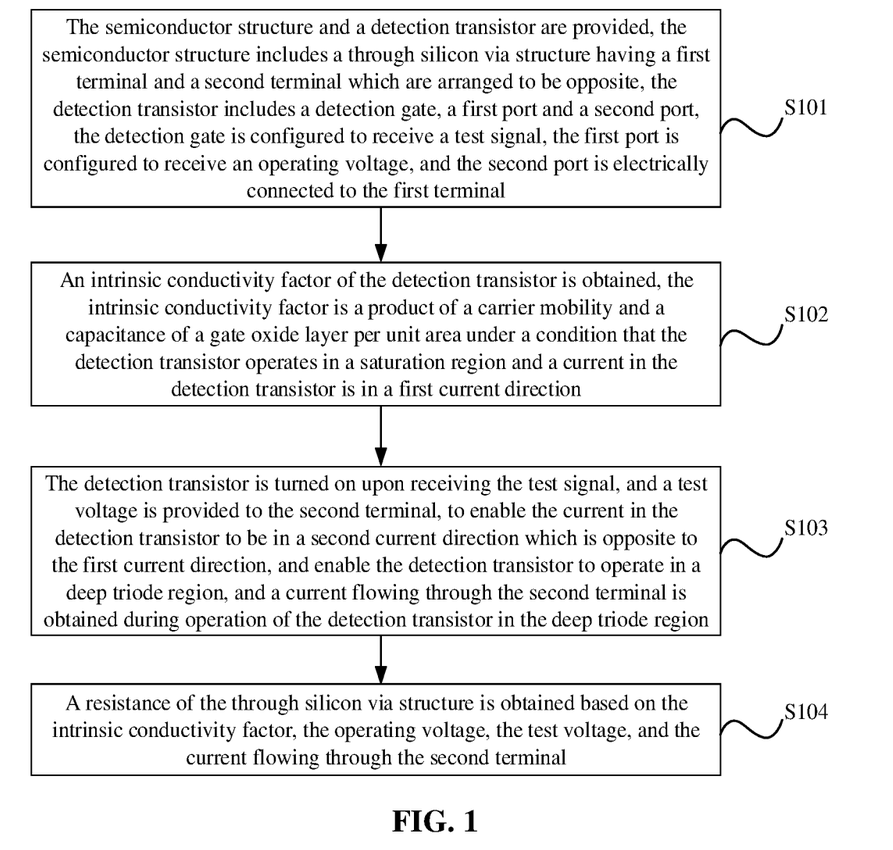
FIG. 1 is a flowchart of testing connectivity of a semiconductor structure provided by an embodiment of the disclosure.
Figure 2:
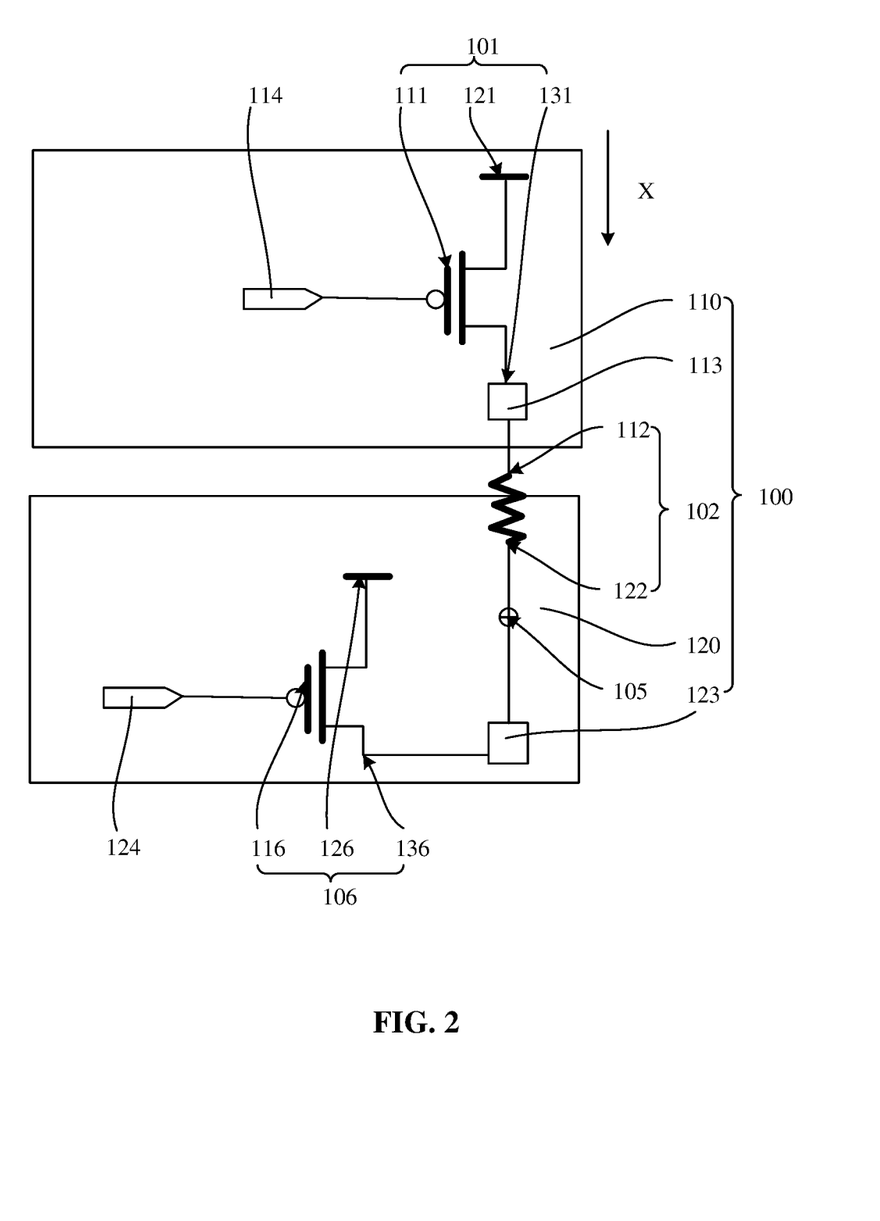
FIG. 2 is a block diagram schematically illustrating a configuration of a circuit for testing connectivity of a semiconductor structure according to an embodiment of the disclosure.

An embodiment of the disclosure provides a test method for testing connectivity of a semiconductor structure. The test method for testing the connectivity of the semiconductor structure provided by the embodiments of the disclosure will be described in detail below in combination with the drawings. FIG. 1 is a flowchart of testing connectivity of a semiconductor structure provided by an embodiment of the disclosure. FIG. 2 is a block diagram schematically illustrating a configuration of a circuit for testing connectivity of a semiconductor structure according to the embodiment of the disclosure.

With reference to FIGS. 1 and 2 in combination, a test method for testing the connectivity of the semiconductor structure includes operations as follows.

At S101, a semiconductor structure 100 and a detection transistor 101 are provided. The semiconductor structure 100 includes a through silicon via structure 102 having a first terminal 112 and a second terminal 122 which are arranged to be opposite. The detection transistor 101 includes a detection gate 111, a first port 121 and a second port 131. The detection gate 111 is configured to receive a test signal, the first port 121 is configured to receive an operating voltage, and the second port 131 is electrically connected to the first terminal 112.

In some embodiments, the semiconductor structure may further include a first electrical connection layer 113. Both of the second port 131 and the first terminal 112 are electrically connected to the first electrical connection layer 113 to achieve an electrical connection of the second port 131 to the first terminal 112.

At S102, an intrinsic conductivity factor of the detection transistor 101 is obtained. The intrinsic conductivity factor is a product of a carrier mobility and a capacitance of a gate oxide layer per unit area under a condition that the detection transistor 101 operates in a saturation region and a current in the detection transistor 101 is in a first current direction X.

The detection transistor 101 is a Positive channel Metal Oxide Semiconductor (PMOS) transistor. The test method further includes an operation as follows. A standard PMOS transistor having a standard aspect ratio, a standard saturation current, a standard gate source voltage and a standard threshold voltage is provided. The intrinsic conductivity factor of the detection transistor 101 is the same as that of the standard PMOS transistor. It should be noted that the standard PMOS transistor is provided by a foundry, so the all of the standard aspect ratio, the standard saturation current, the standard gate source voltage and the standard threshold voltage of the standard PMOS transistor are basic performance parameters provided by the foundry without manual measurement.

The operation that the intrinsic conductivity factor of the detection transistor 101 is obtained includes an operation as follows.

The intrinsic conductivity factor is obtained based on the standard gate source voltage, the standard aspect ratio, the standard saturation current and the standard threshold voltage. The intrinsic conductivity factor, the standard gate source voltage, the standard aspect ratio, the standard saturation current and the standard threshold voltage meets a relationship shown in a formula (1) as follows:

$$I_{Dsat} = \frac{1}{2} A \frac{W}{L} (V_{GS} - V_{TH})^2 \quad (1)$$

where $I_{DSAT}$ denotes the standard saturation current, A denotes the intrinsic conductivity factor, W/L denotes the standard aspect ratio, $V_{GS}$ denotes the standard gate source voltage, and $V_{TH}$ denotes the standard threshold voltage. Since all of the standard aspect ratio W/L, the standard saturation current $I_{DSAT}$, the standard gate source voltage $V_{GS}$, and the standard threshold voltage $V_{TH}$ are known values, the intrinsic conductivity factor A of the standard PMOS transistor, that is, the intrinsic conductivity factor of the detection transistor 101, may be obtained from the above relational expression.

At S103, the detection transistor 101 is turned on upon receiving the test signal, and a test voltage is provided to the second terminal 122, to enable the current in the detection transistor 101 to be in a second current direction which is opposite to the first current direction X, and enable the detection transistor 101 to operate in a deep triode region, and the current flowing through the second terminal 122 is obtained during operation of the detection transistor 101 in the deep triode region.

In some embodiments, the test method may further include an operation as follows. A test signal application structure 114 configured to apply a test signal to the detection gate 111 of the detection transistor 101 is provided. The semiconductor structure may further include a second electrical connection layer 123. A machine provides a first probe and enables the first probe to be in contact with and electrically connected to the second electrical connection layer 123, for applying the test voltage to the second electrical connection layer 123, so as to provide the test voltage to the second terminal 122. The semiconductor structure may further include a probe contact 105. The machine further provides a second probe and enables the second probe to be in contact with and electrically connected to the probe contact 105, for obtaining the current flowing through the probe contact 105 during operation of the detection transistor 101 in the deep triode region. In this way, the current flowing through the second terminal 122 is obtained during the operation of the detection transistor 101 in the deep triode region. In some embodiments, the machine provides a first probe. The first probe may be directly contacted with the second terminal to apply the test voltage to the second terminal. The machine further provides a second probe and enables the second probe to be in direct contact with the second terminal, for obtaining the current flowing through the second terminal during the operation of the detection transistor in the deep triode region.

When the detection transistor 101 is a PMOS transistor, the test signal is at a low level so that the detection transistor 101 is turned on, and the test voltage is greater than the operating voltage. When the detection transistor 101 operates in the deep triode region, the second current direction is a direction that the second port 131 points to the first port 121. In addition, when the semiconductor structure 100 is in a normal operation mode, the test signal may be at a high level, so that the detection transistor 101 is in an off state, thus the normal operation of the semiconductor structure 100 will not be affected.

The PMOS transistor operating in the deep triode region may be regarded as an equivalent controllable resistance controlled by an overdrive voltage. When the gate source voltage is a fixed value, the channel DC on-resistance is approximately a constant resistance.

Therefore, the test method further includes an operation as follows. Before the resistance of the through silicon via structure 102 is obtained, an equivalent resistance of the detection transistor 101 is obtained based on the intrinsic conductivity factor, the operating voltage, and a threshold voltage of the detection transistor 101 when the detection transistor 101 operates in the deep triode region.

In some embodiments, the equivalent resistance of the detection transistor 101 may be calculated according to a relational expression (2) as follows:

$$R_{on} = \frac{1}{A\frac{W_p}{L_P}(V_{DD} - V_{G1} - V_{TH})} \quad (2)$$

where $R_{ON}$ denotes the equivalent resistance of the detection transistor 101, A denotes the intrinsic conductivity factor, $W_p/Lp$ denotes the aspect ratio of the detection transistor 101, $V_{G1}$ denotes the voltage of the detection gate 111 when the detection transistor 101 is turned on, $V_{TH}$ denotes the standard threshold voltage, and $V_{DD}$ denotes the operating voltage. It should be noted that the standard threshold voltage $V_{TH}$ is the same as the threshold voltage of the detection transistor 101.

It should be noted that the aspect ratio $W_p/Lp$ of the detection transistor 101 is a detection transistor 101 of appropriate size designed according to an ideal resistance of the through silicon via structure 102 obtained as required. In a practical application, the aspect ratio $W_p/L_p$ of the detection transistor 101 may be different for ideal resistances of different through silicon via structures 102.

When the detection transistor 101 is turned on, the voltage $V_{G1}$ of the detection gate 111 is 0V.

Therefore, $$R_{on} = \frac{1}{A\frac{W_p}{L_P}(V_{DD} - V_{TH})}.$$

At S104, a resistance of the through silicon via structure 102 is obtained based on the intrinsic conductivity factor, the operating voltage, the test voltage, and the current flowing through the second terminal 122.

In some embodiments, the resistance of the through silicon via structure may be calculated according to a relational expression (3) as follows:

$$R_{TSV} = \frac{V_{TSV} - V_{DD}}{i_D} - R_{on} \quad (3)$$

where $R_{on}$ denotes the equivalent resistance of the detection transistor 101, $i_D$ denotes the current flowing through the second terminal 122, $V_{TSV}$ denotes the test voltage, $V_{DD}$ denotes the operating voltage, and $R_{TSV}$ denotes the resistance of the through silicon via structure 102.

After the resistance $R_{TSV}$ of the through silicon via structure 102 is obtained, $R_{TSV}$ is compared with the resistance value of the ideal through silicon via structure 102, so as to determine whether the connectivity of the semiconductor structure 100 is good. Through the determination of the difference between $R_{TSV}$ and the resistance value of the ideal through silicon via structure 102, the reason for the connectivity problem in the semiconductor structure 100 may be preliminarily inferred, so as to repair the semiconductor structure 100 in a targeted manner. For example, in some embodiments, when the obtained resistance $R_{TSV}$ of the through silicon via structure 102 is much lower than the resistance value of the ideal through silicon via structure 102, and the $R_{TSV}$ is even zero, it can be preliminarily determined that the through silicon via structure 102 is not correctly connected to other conductive structures in the semiconductor structure 100. As a result, the through silicon via structure 102 is short-circuited due to the influence of the other conductive structures in the semiconductor structure 100. Then, based on this preliminary determination, the circuit connected to the through silicon via structure 102 in the semiconductor structure 100 is checked. In some embodiments, when the obtained resistance $R_{TSV}$ of the through silicon via structure 102 is greater than the resistance value of the ideal through silicon via structure 102, it can be preliminarily determined that a void is caused by the incomplete filling of the conductive material in the through silicon via structure 102, or the rupture of a part of the through silicon via structure 102 itself, or poor contact between the through silicon via structure 102 and the first electrical connection layer 113 or the second electrical connection layer 123 due to warpage or migration of the first electrical connection layer 113 or the second electrical connection layer 123. Then, based on this preliminary determination, the through silicon via structure 102 with its own defect is replaced, or the connection strength between the through silicon via structure 102 and the first electrical connection layer 113 or the second electrical connection layer 123 is enhanced. In other embodiments, when the obtained resistance $R_{TSV}$ of the through silicon via structure 102 is close to infinity, it can be preliminarily determined that the through silicon via structure 102 is not electrically connected to the first electrical connection layer 113 or the second electrical connection layer 123, or the through silicon via structure 102 itself is fractured, resulting in an open circuit in the circuit composed of the detection transistor 101 and the through silicon via structure 102. Then, based on this preliminary determination, the through silicon via structure 102 with its own fracture is replaced, or the through silicon via structure 102 is electrically connected to both of the first electrical connection layer 113 and the second electrical connection layer 123.

Therefore, the embodiment of the disclosure is helpful for detecting the connectivity of the semiconductor structure 100 by obtaining the resistance value $R_{TSV}$ of the through silicon via structure 102, and the reason for the connectivity problem in the semiconductor structure 100 may also be preliminarily inferred based on the difference between $R_{TSV}$ and the resistance value of the ideal through silicon via structure 102, so as to repair the semiconductor structure 100 in a targeted manner.

With continued reference to FIG. 1, the test method may further include an operation as follows. A calibration transistor 106 having a calibration gate 116, a third port 126 and a fourth port 136. The calibration gate 116 is configured to receive a control signal, the third port 126 is configured to receive a calibration operating voltage, and the fourth port 136 is electrically connected to the second terminal 122. The calibration transistor 106 is in an off state upon receiving the control signal when the detection transistor 101 is turned on upon receiving the test signal.

In some embodiments, the test method may further include an operation as follows. A control signal application structure 124 which is configured to apply a control signal to the calibration gate 116 of the calibration transistor 106 is provided.

The calibration transistor 106 is also a PMOS transistor like the detection transistor 101. When the detection transistor 101 operates in the deep triode region, the test signal is at the low level and the control signal is at the high level, so that the calibration transistor 106 is in the off state. When the test signal is at the high level, the detection transistor 101 is in the off state, and the control signal is at the low level, so that the calibration transistor 106 operates in the deep triode region.

The test method may further include operations as follows. After the resistance of the through silicon via structure 102 is obtained, an calibration intrinsic conductivity factor of the calibration transistor 106 is obtained. The calibration intrinsic conductivity factor is a product of a carrier mobility and a capacitance of a gate oxide layer per unit area under a condition that the calibration transistor 106 operates in a saturation region and a current in the calibration transistor 106 is in a third current direction. The test signal is changed to enable the detection transistor 101 to be in the off state. The control signal is changed to enable the calibration transistor 106 to be turned on, and the calibration test voltage is provided to the first terminal 112 to enable the current in the calibration transistor 106 to be in a fourth current direction which is opposite to the third current direction, and enable the calibration transistor 106 to operate in the deep triode region, and the calibration current flowing through the first terminal 112 is obtained during the operation of the calibration transistor 106 in the deep triode region. A calibration resistance of the through silicon via structure 102 is obtained based on the calibration intrinsic conductivity factor, the calibration operating voltage, the calibration test voltage and the calibration current flowing through the first terminal 112.

Since both of the calibration transistor 106 and the detection transistor 101 are PMOS transistors, the method of obtaining the calibration intrinsic conductivity factor of the calibration transistor 106 is the same as the above method of obtaining the intrinsic conductivity factor of the detection transistor 101, which will not be repeated here.

In some embodiments, after the current flowing through the second terminal 122 is obtained during operation of the detection transistor 101 in the deep triode region, the machine is removed to provide a first probe and a second probe. The machine provides a third probe and enables the third probe to be in contact with and electrically connected to the first electrical connection layer 113 for applying the calibration test voltage to the first electrical connection layer 113, so as to provide the calibration test voltage to the first terminal 112. The machine further provides a fourth probe and enables the fourth probe to be in contact with and electrically connected to the first electrical connection layer 113, for obtaining the current flowing through the probe contact 105 during operation of the calibration transistor 106 in the deep triode region, so as to obtain the current flowing through the first electrical connection layer 113 during the operation of the calibration transistor 106 in the deep triode region. In some embodiments, the machine provides a third probe. The third probe may be directly contacted with the first terminal to apply the calibration test voltage to the first terminal. The machine further provides a fourth probe and enables the fourth probe to be in direct contact with the first terminal for obtaining the current flowing through the first terminal during the operation of the calibration transistor in the deep triode region.

When the calibration transistor 106 operates in the deep triode region, the calibration test voltage is greater than the calibration operating voltage, and the fourth current direction is a direction that the fourth port 136 points to the third port 126. In addition, when the semiconductor structure 100 is in the normal operation mode, both of the test signal and the control signal may be at the high level, so that both of the detection transistor 101 and the calibration transistor 106 are in the off state, thus the normal operation of the semiconductor structure 100 will not be affected.

In some embodiments, the equivalent resistance of the calibration transistor 106 may be calculated according to a relational expression (4) as follows:

$$R'_{on} = \frac{1}{A'\frac{W'_p}{L'_p}(V'_{DD} - V'_{G1} - V'_{TH})} \quad (4)$$

where $R'_{on}$ denotes the equivalent resistance of the calibration transistor 106, A' denotes the intrinsic conductivity factor of the calibration transistor 106, $W'_p/L'_p$ denotes the aspect ratio of the calibration transistor 106, $V'_{G1}$ denotes the voltage of the calibration gate 116 when the calibration transistor 106 is turned on, $V'_{TH}$ denotes the threshold voltage of the calibration transistor 106, and $V'_{DD}$ denotes the calibration operating voltage. It should be noted that the threshold voltage $V'_{TH}$ of the calibration transistor 106 is the same as the standard threshold voltage $V_{TH}$.

It should be noted that the aspect ratio $W'_p/L'_p$ of the calibration transistor 106 is a calibration transistor 106 of appropriate size designed according to the ideal resistance of the through silicon via structure 102 obtained as required. In a practical application, the aspect ratio $W'_p/L'_p$ of the calibration transistor 106 may be different for ideal resistances of different through silicon via structures 102.

When the calibration transistor 106 is turned on, the voltage $V'_{G1}$ of the calibration gate 116 is 0V.

Therefore, $$R'_{on} = \frac{1}{A'\frac{W'_p}{L'_p}(V'_{DD} - V'_{TH})}.$$

In some embodiments, the calibration resistance of the through silicon via structure may be calculated according to a relational expression (5) as follows:

$$R'_{TSV} = \frac{V'_{TSV} - V'_{DD}}{i'_D} - R'_{on} \quad (5)$$

where $R'_{on}$ denotes the equivalent resistance of the calibration transistor 106, $i'_D$ denotes the current flowing through the first terminal 112, $V'_{TSV}$ denotes the calibration test voltage, $V'_{DD}$ denotes the calibration operating voltage, and $R'_{TSV}$ denotes the calibration resistance of the through silicon via structure 102.

After the calibration resistance of the through silicon via structure 102 is obtained, the resistance $R_{TSV}$ of the through silicon via structure 102 is compared with the calibration resistance $R'_{TSV}$ of the through silicon via structure 102 to determine the accuracy of the obtained resistance $R_{TSV}$ of the through silicon via structure 102. When the difference between $R_{TSV}$ and $R_{TCV}$ is large, for example, when the ratio of the difference between $R_{TSV}$ and $R'_{TSV}$ to $R_{TSV}$ is greater than 5%, the obtained $R_{TSV}$ or $R'_{TSV}$ is inaccurate. A new $R_{TSV}$ to $R'_{TSV}$ ratio is obtained again by checking the connection relationship between the structures in the test method, which is beneficial to improve the accuracy of the resistance of the through silicon via structure 102 obtained by the test method provided in the embodiments of the disclosure.

In summary, the intrinsic conductivity factor of the detection transistor 101 is obtained according to the basic performance parameters of the PMOS transistor provided by the foundry. Through the adjustment of the test signal and the application of the test voltage to the second terminal 122 of the through silicon via structure 102, the detection transistor 101 is operated in the deep triode region to obtain the equivalent resistance of the detection transistor 101. The current flowing through the second terminal 122 is obtained during the operation of the detection transistor 101 in the deep triode region, and the resistance of the through silicon via structure 102 is obtained based on the intrinsic conductivity factor, operating voltage, test voltage and current flowing through the second terminal 122 of the detection transistor 101. Through the comparison of the obtained resistance of the through silicon via structure 102 with the resistance of the ideal through silicon via structure 102, it can be determined that whether the connectivity of the semiconductor structure 100 is good. Through the determination of the difference between the obtained resistance of the through silicon via structure 102 and the resistance of the ideal through silicon via structure 102, the reason for the connectivity problem in the semiconductor structure 100 may be preliminarily inferred, so as to repair the semiconductor structure 100 in a targeted manner. In addition, when the semiconductor structure 100 is in the normal operation mode, the detection transistor 101 may be enabled to be in the off state by the test signal, so that the normal operation of the semiconductor structure 100 will not be affected.

Figure 3:
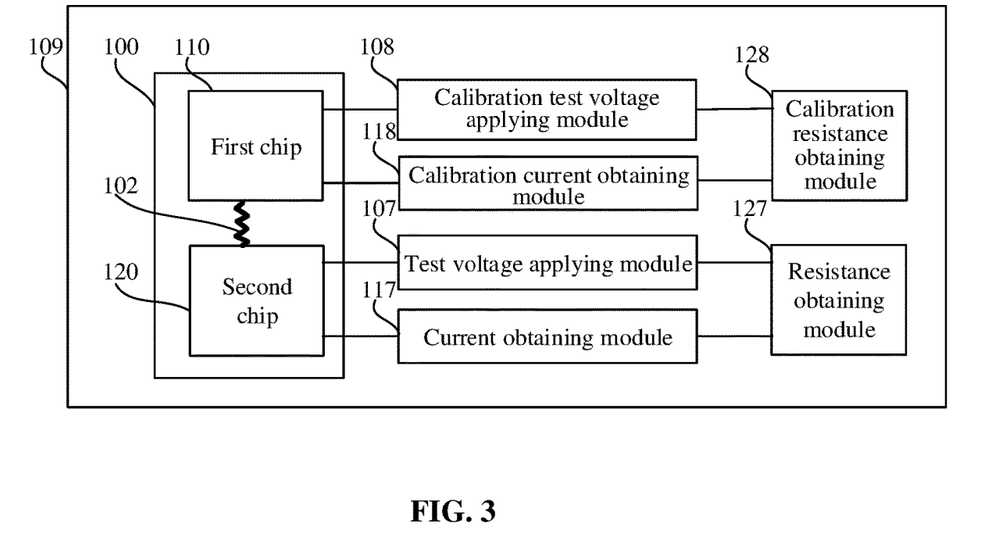
FIG. 3 is a schematic diagram of functional modules of a test system for testing connectivity of a semiconductor structure provided by an embodiment of the disclosure.

An embodiment of the disclosure further provides a test system for testing the connectivity of the semiconductor structure, which is configured to implement the above-mentioned test method for testing the connectivity of the semiconductor structure. FIG. 3 is a schematic diagram of functional modules of a test system for testing connectivity of a semiconductor structure provided by an embodiment of the disclosure.

With reference to FIGS. 2 and 3 in combination, a test system 109 for testing the connectivity of the semiconductor structure includes: a semiconductor structure 100, a detection transistor 101, a test voltage applying module 107, a current obtaining module 117 and a resistance obtaining module 127. The semiconductor structure 100 includes a through silicon via structure 102 having a first terminal 112 and a second terminal 122 which are arranged to be opposite. The first terminal 112 is electrically connected to a first chip 110, and the second terminal 122 is electrically connected to a second chip 120. The detection transistor 101 is arranged in the first chip 110. The detection transistor 101 includes a detection gate 111, a first port 121 and a second port 131. The detection gate 111 is configured to receive a test signal, the first port 121 is configured to receive an operating voltage, and the second port 131 is electrically connected to the first terminal 112. The test voltage applying module 107 is configured to provide a test voltage to the second terminal 122 when the detection transistor 101 is turned on upon receiving the test signal, to enable the detection transistor to operate in the deep triode region. The current obtaining module 117 is configured to obtain a current flowing through the second terminal during operation of the detection transistor in the deep triode region. The resistance obtaining module 127 is configured to obtain a resistance of the through silicon via structure 102 based on the intrinsic conductivity factor, the operating voltage, the test voltage and the current flowing through the second terminal 122.

The detection transistor 101 is a PMOS transistor, the first port 121 receives the operating voltage, and the detection gate 111 receives the test signal, to enable the detection transistor 101 to be turned on, and when the test voltage is not provided to the second terminal 122, the detection transistor 101 operates in the saturation region, and the current in the detection transistor 101 is in a first current direction. The test voltage applying module 107 is configured to change the operating state of the detection transistor 101. In some embodiments, the test voltage applying module 107 provides a test voltage to the second terminal 122, to enable the current in the detection transistor 101 to be in a second current direction which is opposite to the first current direction, and enable the detection transistor 101 to operate in the deep triode region.

In some embodiments, the test system 109 may further include a calibration transistor 106 arranged in the second chip 120. The calibration transistor 106 includes a calibration gate 116, a third port 126 and a fourth port 136. The calibration gate 116 is configured to receive a control signal, the third port 126 is configured to receive a calibration operating voltage, and the fourth port 136 is electrically connected to the second terminal 122. The calibration transistor 106 is in the off state upon receiving the control signal when the detection transistor 101 is turned on upon receiving the test signal.

The test system 109 may further include a calibration test voltage applying module 108, a calibration current obtaining module 118 and a calibration resistance obtaining module 128. The calibration test voltage applying module 108 is configured to provide a calibration test voltage to the first terminal 112 when the detection transistor 101 is in the off state upon receiving the test signal and the calibration transistor 106 is turned on upon receiving the control signal, to enable the calibration transistor 106 to operate in the deep triode region. The calibration current obtaining module 118 is configured to obtain a current flowing through the first terminal 112 during operation of the calibration transistor 106 in the deep triode region. The calibration resistance obtaining module 128 is configured to obtain a calibration resistance of the through silicon via structure 102 based on the calibration intrinsic conductivity factor, the calibration operating voltage, the calibration test voltage, and the current flowing through the first terminal 112. The calibration transistor 106 is also a PMOS transistor like the detection transistor 101.

The third port 126 receives the calibration operating voltage, and the calibration gate 116 receives the control signal, to enable the calibration transistor 106 to be turned on, and when the calibration test voltage is not provided to the first terminal 112, the calibration transistor 106 operates in the saturation region, and the current in the calibration transistor 106 is in a third current direction. The calibration test voltage applying module 108 is configured to change the operating state of the calibration transistor 106. In some embodiments, the calibration test voltage applying module 108 provides a calibration test voltage to the first terminal 112, to enable the current in the calibration transistor 106 to be in a fourth current direction which is opposite to the third current direction, and enable the calibration transistor 106 to operate in the deep triode region.

In summary, through the adjustment of the test signal and the application of the test voltage to the second terminal 122 of the through silicon via structure 102 through the test voltage applying module 107, the detection transistor 101 is enabled to be operated in the deep triode region. The current flowing through the second terminal 122 is obtained by the current obtaining module 117 during the operation of the detection transistor 101 in the deep triode region. The resistance of the through silicon via structure 102 is obtained by the resistance obtaining module 127 based on the intrinsic conductivity factor, operating voltage, test voltage, and current flowing through the second terminal 122 of the detection transistor 101. Through the comparison of the obtained resistance of the through silicon via structure 102 with the resistance of the ideal through silicon via structure 102, it can be determined whether the connectivity of the semiconductor structure 100 is good. In addition, through the determination of the difference between the obtained resistance of the through silicon via structure 102 and the resistance of the ideal through silicon via structure 102, the reason for the connectivity problem in the semiconductor structure 100 may be preliminarily inferred, so as to repair the semiconductor structure 100 in a targeted manner.

It can be understand by those skilled in the art that the above-mentioned implementations are some embodiments for implementing the disclosure, and in practical applications, various changes may be made in form and details without departing from the spirit and scope of the disclosure. Any person skilled in the art may make changes and modifications without departing from the spirit and scope of the disclosure. Therefore, the scope of protection of the disclosure shall be subject to the scope defined in the claims.

What is claimed is:

1. A test method for testing connectivity of a semiconductor structure, comprising:
   providing the semiconductor structure and a detection transistor, wherein the semiconductor structure comprises a through silicon via structure having a first terminal and a second terminal which are arranged to be opposite, the detection transistor comprises a detection gate, a first port and a second port, the detection gate is configured to receive a test signal, the first port is configured to receive an operating voltage, and the second port is electrically connected to the first terminal;
   obtaining an intrinsic conductivity factor of the detection transistor, the intrinsic conductivity factor being a product of a carrier mobility and a capacitance of a gate oxide layer per unit area under a condition that the detection transistor operates in a saturation region and a current in the detection transistor is in a first current direction;
   turning the detection transistor on upon receiving the test signal, and providing a test voltage to the second terminal, to enable the current in the detection transistor to be in a second current direction which is opposite to the first current direction, and enable the detection transistor to operate in a deep triode region, and obtaining a current flowing through the second terminal during operation of the detection transistor in the deep triode region; and
   obtaining a resistance of the through silicon via structure based on the intrinsic conductivity factor, the operating voltage, the test voltage, and the current flowing through the second terminal.

2. The test method of claim 1, further comprising: after the obtaining the intrinsic conductivity factor and before the obtaining the resistance of the through silicon via structure, obtaining an equivalent resistance of the detection transistor based on the intrinsic conductivity factor, the operating voltage and a threshold voltage of the detection transistor when the detection transistor operates in the deep triode region.

3. The test method of claim 2, wherein the detection transistor is a Positive channel Metal Oxide Semiconductor (PMOS) transistor, the test voltage is greater than the operating voltage, and when the detection transistor operates in the deep triode region, the second current direction is a direction that the second port points to the first port.

4. The test method of claim 3, further comprising: providing a standard PMOS transistor having a standard aspect ratio, a standard saturation current, a standard gate source voltage and a standard threshold voltage, the intrinsic conductivity factor of the detection transistor being the same as that of the standard PMOS transistor,
   wherein the obtaining the intrinsic conductivity factor of the detection transistor comprises:
   obtaining the intrinsic conductivity factor based on the standard gate source voltage, the standard aspect ratio, the standard saturation current and the standard threshold voltage, wherein the intrinsic conductivity factor, the standard gate source voltage, the standard aspect ratio, the standard saturation current and the standard threshold voltage meets a relation as follows:

$$I_{Dsat} = \frac{1}{2} A \frac{W}{L} (V_{GS} - V_{TH})^2,$$

where $I_{Dsat}$ denotes the standard saturation current, A denotes the intrinsic conductivity factor, $$\frac{W}{L}$$

denotes the standard aspect ratio, $V_{GS}$ denotes the standard gate source voltage, and $V_{TH}$ denotes the standard threshold voltage.

5. The test method of claim 4, wherein the obtaining the equivalent resistance of the detection transistor comprises:
   calculating the equivalent resistance of the detection transistor according to a relational expression as follows:

$$R_{on} = \frac{1}{A \frac{W_p}{L_p} (V_{DD} - V_{G1} - V_{TH})}$$

where $R_{on}$ denotes the equivalent resistance of the detection transistor, A denotes the intrinsic conductivity factor, $$\frac{W_P}{L_P}$$

denotes an aspect ratio of the detection transistor, $V_{G1}$ denotes a voltage of the detection gate when the detection transistor is turned on, $V_{TH}$ denotes the standard threshold voltage, and $V_{DD}$ denotes the operating voltage.

6. The test method of claim 5, wherein the voltage of the detection gate is 0V when the detection transistor is turned on.

7. The test method of claim 6, wherein the obtaining the resistance of the through silicon via structure comprises:
 calculating the resistance of the through silicon via structure according to a relational expression as follows:

$$R_{TSV} = \frac{V_{TSV} - V_{DD}}{i_D} - R_{on}$$

where $R_{on}$ denotes the equivalent resistance of the detection transistor, $i_D$ denotes the current flowing through the second terminal, $V_{TSV}$ denotes the test voltage, $V_{DD}$ denotes the operating voltage, and $R_{TSV}$ denotes the resistance of the through silicon via structure.

8. The test method of claim 1, further comprising: providing a calibration transistor having a calibration gate, a third port and a fourth port, wherein the calibration gate is configured to receive a control signal, the third port is configured to receive a calibration operating voltage, and the fourth port is electrically connected to the second terminal, and
 wherein the calibration transistor is in an off state upon receiving the control signal when the detection transistor is turned on upon receiving the test signal.

9. The test method of claim 8, wherein the detection transistor and the calibration transistor are both Positive channel Metal Oxide Semiconductor (PMOS) transistors; when the detection transistor operates in a deep triode region, the test signal is at a low level and the control signal is at a high level, to enable the calibration transistor to be in the off state.

10. The test method of claim 9, further comprising: after the obtaining the resistance of the through silicon via structure,
 obtaining a calibration intrinsic conductivity factor of the calibration transistor, the calibration intrinsic conductivity factor being a product of a carrier mobility and a capacitance of a gate oxide layer per unit area under a condition that the calibration transistor operates in a saturation region and a current in the calibration transistor is in a third current direction;
 changing the test signal to enable the detection transistor to be in an off state;
 changing the control signal to enable the calibration transistor to be turned on, and providing a calibration test voltage to the first terminal to enable the current in the calibration transistor to be in a fourth current direction which is opposite to the third current direction, and enable the calibration transistor to operate in the deep triode region, and obtaining a calibration current flowing through the first terminal during operation of the calibration transistor in the deep triode region; and
 obtaining a calibration resistance of the through silicon via structure based on the calibration intrinsic conductivity factor, the calibration operating voltage, the calibration test voltage and the calibration current flowing through the first terminal.

11. The test method of claim 10, further comprising: after the obtaining the calibration resistance of the through silicon via structure,
 comparing the resistance of the through silicon via structure with the calibration resistance of the through silicon via structure, to determine accuracy of the obtained resistance of the through silicon via structure.

12. A test system for testing connectivity of a semiconductor structure, comprising:
 the semiconductor structure comprising a through silicon via structure having a first terminal and a second terminal which are arranged to be opposite, the first terminal being electrically connected to a first chip, and the second terminal being electrically connected to a second chip;
 a detection transistor arranged in the first chip, wherein the detection transistor comprises a detection gate, a first port and a second port, the detection gate is configured to receive a test signal, the first port is configured to receive an operating voltage, and the second port is electrically connected to the first terminal;
 a test voltage applying module configured to provide a test voltage to the second terminal when the detection transistor is turned on upon receiving the test signal, to enable the detection transistor to operate in a deep triode region;
 a current obtaining module configured to obtain a current flowing through the second terminal during operation of the detection transistor in the deep triode region; and
 a resistance obtaining module configured to obtain a resistance of the through silicon via structure based on an intrinsic conductivity factor, the operating voltage, the test voltage and the current flowing through the second terminal.

13. The test system of claim 12, further comprising:
 a calibration transistor arranged in the second chip, wherein the calibration transistor comprises a calibration gate, a third port and a fourth port, the calibration gate is configured to receive a control signal, the third port is configured to receive a calibration operating voltage, the fourth port is electrically connected to the second terminal, and the calibration transistor is in an off state upon receiving the control signal when the detection transistor is turned on upon receiving the test signal.

14. The test system of claim 13, further comprising:
 a calibration test voltage applying module configured to provide a calibration test voltage to the first terminal when the detection transistor is in the off state upon receiving the test signal and the calibration transistor is turned on upon receiving the control signal, to enable the calibration transistor to operate in a deep triode region;
 a calibration current obtaining module configured to obtain a current flowing through the first terminal during operation of the calibration transistor in the deep triode region; and a calibration resistance obtaining module configured to obtain a calibration resistance of the through silicon via structure based on a calibration intrinsic conductivity factor, the calibration operating voltage, the calibration test voltage, and the current flowing through the first terminal.

15. The test system of claim 13, wherein the detection transistor and the calibration transistor are both Positive channel Metal Oxide Semiconductor (PMOS) transistors.

* * * * *